United States Patent
McMullen et al.

(10) Patent No.: US 10,060,963 B2
(45) Date of Patent: Aug. 28, 2018

(54) PROBE SYSTEMS, STORAGE MEDIA, AND METHODS FOR WAFER-LEVEL TESTING OVER EXTENDED TEMPERATURE RANGES

(71) Applicant: Cascade Microtech, Inc., Beaverton, OR (US)

(72) Inventors: Timothy Allen McMullen, Lino Lakes, MN (US); Jeffery Allan Shepler, Vadnais Heights, MN (US); Clint Vander Giessen, Beaverton, OR (US)

(73) Assignee: FormFactor Beaverton, Inc., Beaverton, OR (US)

( * ) Notice: Subject to any disclaimer, the term of this patent is extended or adjusted under 35 U.S.C. 154(b) by 0 days.

(21) Appl. No.: 15/471,199

(22) Filed: Mar. 28, 2017

(65) Prior Publication Data

US 2017/0285083 A1    Oct. 5, 2017

Related U.S. Application Data

(60) Provisional application No. 62/317,168, filed on Apr. 1, 2016.

(51) Int. Cl.
*G01R 31/00*    (2006.01)
(52) U.S. Cl.
CPC .................. *G01R 31/003* (2013.01)

(58) Field of Classification Search
CPC ................ G01R 31/26; G01R 31/2642; G01R 31/2648; G01R 31/2831; G01R 31/31702; G01R 31/2874; G01R 31/2875; G01R 31/2877; G01R 31/2856
See application file for complete search history.

(56) References Cited

U.S. PATENT DOCUMENTS

| | | | |
|---|---|---|---|
| 6,097,200 A | 8/2000 | Turlapaty et al. | |
| 7,233,160 B2 * | 6/2007 | Hayden | G01R 1/06772 324/755.07 |
| 7,888,957 B2 * | 2/2011 | Smith | G01R 1/07378 324/754.07 |
| 8,823,406 B2 | 9/2014 | Bolt et al. | |
| 9,244,099 B2 | 1/2016 | Duckworth et al. | |
| 2010/0251545 A1 | 10/2010 | Hayden et al. | |

FOREIGN PATENT DOCUMENTS

EP    2887089    6/2015

* cited by examiner

*Primary Examiner* — Tung X Nguyen
(74) *Attorney, Agent, or Firm* — Dascenzo Intellectual Property Law, P.C.

(57) ABSTRACT

Probe systems, storage media, and methods for wafer-level testing over extended temperature ranges are disclosed herein. The methods are configured to test a plurality of devices under test (DUTs) present on a substrate. The probe systems are programmed to perform the methods. The storage media include computer-readable instructions that direct a probe system to perform the methods.

21 Claims, 8 Drawing Sheets

PROBE SYSTEMS, STORAGE MEDIA, AND METHODS FOR WAFER-LEVEL TESTING OVER EXTENDED TEMPERATURE RANGES

RELATED APPLICATION

This application claims priority to U.S. Provisional Patent Application No. 62/317,168, entitled METHODS FOR WAFER-LEVEL TESTING OVER EXTENDED TEMPERATURE RANGES, which was filed on Apr. 1, 2016, and the complete disclosure of which is hereby incorporated by reference.

FIELD OF THE DISCLOSURE

The present disclosure relates generally to probe systems, storage media, and methods for wafer-level testing over extended temperature ranges.

BACKGROUND OF THE DISCLOSURE

Wafer-level reliability testing may include simultaneous testing of large numbers of devices under test (DUTs) that are present on a wafer, or substrate. Probe head assemblies that are utilized to perform wafer-level reliability testing may include a plurality of probe heads, with each probe head including one or more probe tips configured to contact a corresponding contact pad of a corresponding DUT.

Wafer-level reliability tests often may be performed at elevated temperatures and/or over a range of test temperatures. In general, a coefficient of thermal expansion of the probe head assembly may not be matched, or identically matched, to a coefficient of thermal expansion of the substrate. Thus, changes in test temperature may lead to differences in a spacing of the probe heads, or the probe tips thereof, when compared, or relative, to a spacing of the DUTs, or the contact pads thereof. In addition, the substrate also may distort, twist, and/or deform during heating and/or cooling thereof, thereby changing a distance between a region of the probe head assembly and the substrate relative to a distance between another region of the probe head assembly and the substrate.

In order to permit testing despite this spacing difference, probe head assemblies may be designed such that the spacing of the probe heads matches the spacing of the DUTs at one temperature, such as a design temperature. In addition, the contact pads of the DUTs may be oversized to accommodate at least a threshold spacing difference, such as may be expected and/or encountered over a given test temperature range.

While such an approach may be effective at permitting the wafer-level reliability tests to be performed, the oversized contact pads may consume valuable space on the surface of the DUT, and it may be desirable to decrease the size of the contact pads. Additionally or alternatively, a contact pad size necessary to permit testing over a desired temperature range may be prohibitively large, especially for test structures that may be positioned within scribe lines between adjacent DUTs. Thus, there exists a need for improved probe systems, storage media, and methods for wafer-level testing over extended temperature ranges.

SUMMARY OF THE DISCLOSURE

Probe systems, storage media, and methods for wafer-level testing over extended temperature ranges are disclosed herein. The methods are configured to test a plurality of devices under test (DUTs) present on a substrate with a probe head assembly that includes a plurality of probe heads. Each DUT in the plurality of DUTs includes a corresponding contact pad and each of the plurality of probe heads includes a probe tip configured to communicate with the corresponding contact pad. The plurality of DUTs is arranged within a DUT array that defines an average DUT array spacing and the plurality of probe heads is arranged within a probe head array that defines an average probe head array spacing. The average probe head array spacing is matched to the average DUT array spacing at a design temperature of the probe head assembly.

The methods include equilibrating the substrate and a probe head assembly at a test temperature and aligning each probe tip in a first subset of the plurality of probe heads with a corresponding contact pad of a corresponding DUT in the plurality of DUTs. The methods further include bringing each probe tip in the first subset of the plurality of probe heads into contact with the corresponding contact pad of a corresponding DUT in a first subset of the plurality of DUTs. The methods also include testing the operation of the first subset of the plurality of DUTs and repeating the methods to test a second subset of the plurality of DUTs.

The probe systems are programmed to perform the methods. The storage media include computer-readable instructions that direct a probe system to perform the methods.

DETAILED DESCRIPTION AND BEST MODE OF THE DISCLOSURE

Figure 4:
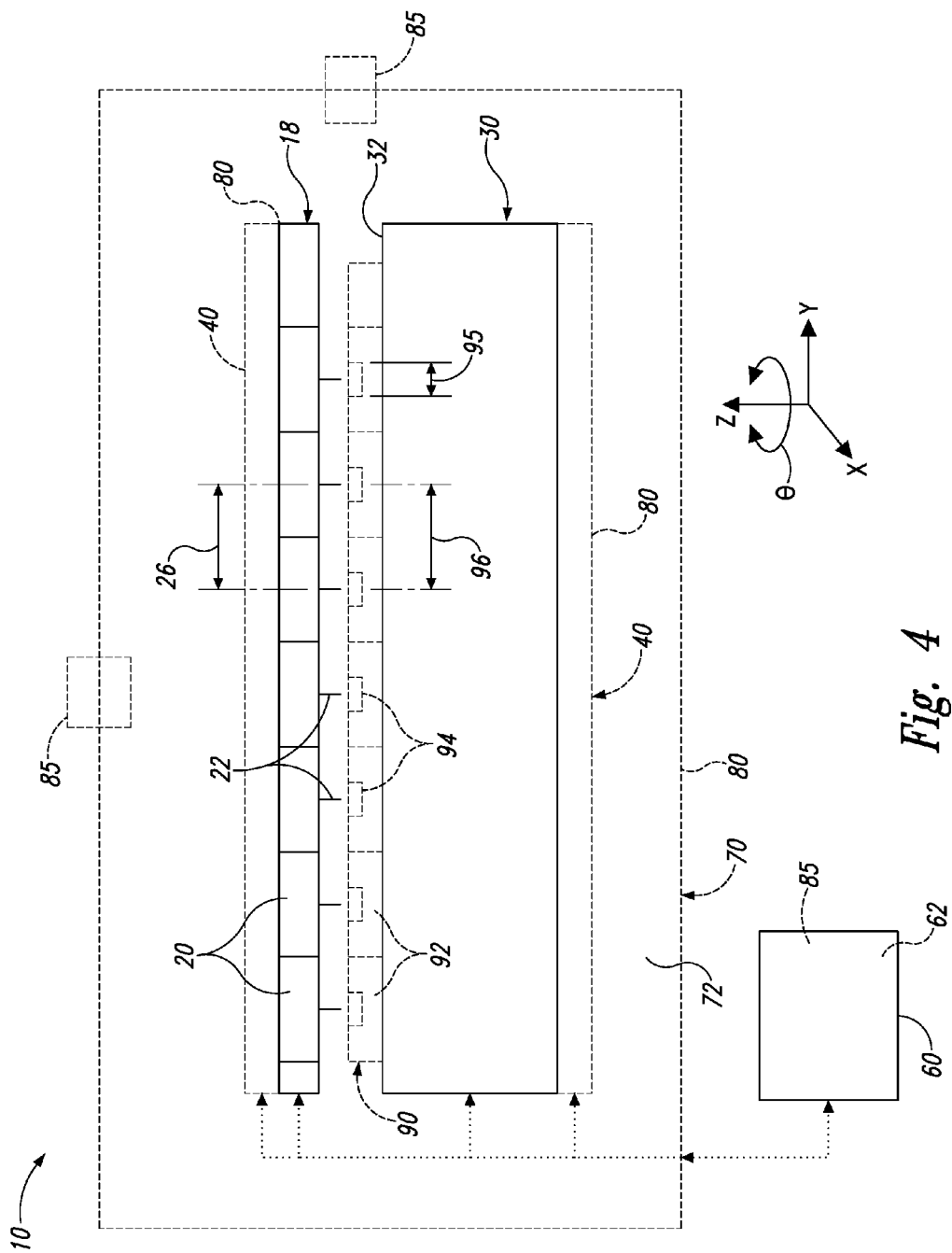
FIG. 4 is a schematic illustration of examples of a probe system according to the present disclosure.

FIG. 4 provides examples of probe systems 10, according to the present disclosure, FIG. 4 provides examples of methods 100, according to the present disclosure, while FIGS. 6-15 provide examples of probe heads 20 that may be utilized during methods 100 and/or of substrates 90 including devices under test (DUTs) 92 that may be tested during methods 100. Elements that serve a similar, or at least substantially similar, purpose are labeled with like numbers in FIGS. 4-15, and these elements may not be discussed in detail herein with reference to each of FIGS. 4-15. Similarly, all elements may not be labeled in each of FIGS. 4-15, but reference numerals associated therewith may be utilized herein for consistency. Elements, components, and/or features that are discussed herein with reference to one or more of FIGS. 4-15 may be included in and/or utilized with any of FIGS. 4-15 without departing from the scope of the present disclosure. In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

Figure 1:
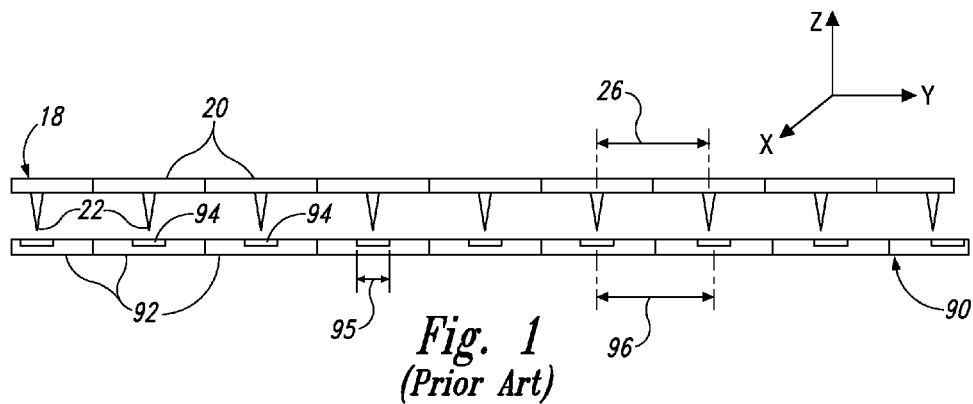
FIG. 1 is a schematic illustration of a prior art approach to wafer-level reliability testing over extended temperature ranges.
Figure 2:
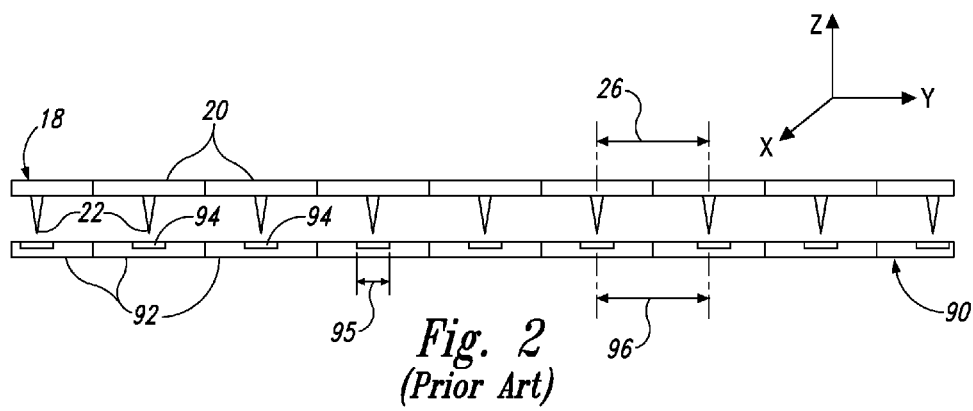
FIG. 2 is another schematic illustration of a prior art approach to wafer-level reliability testing over extended temperature ranges.
Figure 3:
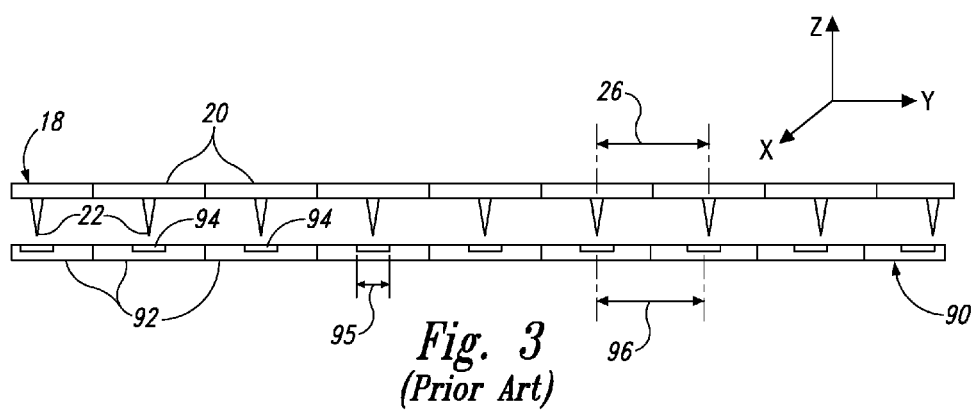
FIG. 3 is another schematic illustration of a prior art approach to wafer-level reliability testing over extended temperature ranges.

FIGS. 1-3 are schematic illustrations of a prior art approach to wafer-level reliability testing over extended temperature ranges. Specifically, FIGS. 1-3 illustrate testing of a substrate 90, which includes a plurality of DUTs 92 and a corresponding plurality of contact pads 94, at three temperatures. More specifically, FIG. 1 illustrates probe head assembly 18 and substrate 90 at a temperature that is less than a design temperature for the probe head assembly, FIG. 2 illustrates the probe head assembly and the substrate at the design temperature, and FIG. 3 illustrates the probe head assembly and the substrate at a temperature that is greater than the design temperature.

The testing is performed with a probe head assembly 18 including a plurality of probe heads 20. Each probe head 20 includes one or more probe tips 22. Probe tips 22 are oriented relative to one another to contact corresponding contact pads 94 of DUTs 92.

In the system illustrated in FIGS. 1-3, thermally induced expansion and/or contraction of probe head 20 occurs at a different rate than thermally induced expansion and/or contraction of substrate 90. As such, and as illustrated, an orientation of probe tips 22 relative to contact pads 94 varies with temperature.

Stated another way, DUTs 92 are arranged on substrate 90 in a DUT array that defines an average DUT array spacing 96. The DUT array may include a plurality of DUT rows, which defines an average DUT row spacing, and a plurality of DUT columns, which defines an average DUT column spacing. The average DUT array spacing may include the average DUT row spacing and/or the average DUT column spacing. As an example, the average DUT array spacing may include a row value, as measured along the plurality of DUT rows, and/or a different and/or separate column value, as measured along the plurality of DUT columns.

Similarly, probe heads 20 and/or probe tips 22 thereof are arranged within probe head assembly 18 in a probe head array that defines an average probe head array spacing 26. The probe head array may include one or more probe head rows, which define an average probe head row spacing. The probe head array additionally or alternatively may include one or more probe head columns, which define an average probe head column spacing. Similar to the average DUT array spacing, the average probe head array spacing may include the average probe head row spacing, as measured along the one or more probe head rows, and/or the average probe head column spacing, as measured along the one or more probe head columns.

Both average DUT array spacing 96 and average probe head array spacing 26 may vary with temperature, and this variation may not be the same for both the DUT array and the probe head array, such as may be due to differences in a coefficient of thermal expansion therebetween. As such, the relative spacing between probe tips 22 and contact pads 94 may vary with temperature.

As an example, probe head assembly 18 may be configured such that probe head array spacing 26 matches, or at least substantially matches, DUT array spacing 96 at the design temperature, as illustrated in FIG. 2. However, probe head array spacing 26 may differ from DUT array spacing 96 at other temperatures, such as is illustrated in FIGS. 1 and 3. In the example of FIG. 1, average probe head array spacing 26 is less than average DUT array spacing 96 at temperatures that are lower than the design temperature. In the example of FIG. 3, average probe head array spacing 26 is greater than average DUT array spacing 96 at temperatures that are higher than the design temperature. Stated another way, a coefficient of thermal expansion of probe head assembly 18 is greater than a coefficient of thermal expansion of substrate 90.

However, this specific relative behavior is not required. As an example, the average probe head array spacing may be greater than the average DUT array spacing at temperatures that are lower than the design temperature and less than the average DUT array spacing at temperatures that are higher than the design temperature. Stated another way, the coefficient of thermal expansion of probe head assembly 18 may be less than the coefficient of thermal expansion of substrate 90.

To accommodate the above-described variation between the average probe head array spacing and the average DUT array spacing, while permitting testing over a broad test temperature range, substrate 90 of FIGS. 1-3 includes contact pads 94 that are larger than what otherwise might be needed to permit alignment between probe tips 22 of probe head assembly 18 and contact pads 94 of DUTs 92 at a single temperature. As an example, a width 95 of contact pads 94 may be selected to permit probe tips 22 of probe head assembly 18 to maintain contact with the contact pads over the broad test temperature range despite thermally induced differences between the average probe head array spacing and the average DUT array spacing. In DUTs that are tested with conventional probe systems, width 95 may be on the order of hundreds of micrometers, with a 200 micrometer by 200 micrometer contact pad being common. While such a configuration may permit testing over an extended temperature range, contact pads 94 may consume valuable space on substrate 90, may be too large to be included on some substrates and/or with some DUT configurations, and/or may restrict, limit, and/or decrease a number of DUTs 92 that may be fabricated on substrate 90.

FIG. 4 is a schematic illustration of examples of probe systems 10 according to the present disclosure. Probe system 10 is configured to simultaneously test a plurality of DUTs 92 present on a substrate 90. DUTs 92 include corresponding contact pads 94 and are arranged on the substrate in a DUT array that defines an average DUT array spacing 96, as discussed herein with reference to FIGS. 1-3.

Probe system 10 includes a probe head assembly 18, a chuck 30, and a controller 60. Probe head assembly 18 includes a plurality of probe heads 20, and each of the probe heads includes at least one probe tip 22. Probe tips 22 are configured to electrically contact and/or communicate with corresponding contact pads 94 on corresponding DUTs 92. The plurality of probe heads 20 is arranged, within the probe head assembly, in a probe head array that defines an average probe head array spacing 26, as discussed herein with reference to FIGS. 1-3. The average probe head array spacing may be matched, or at least substantially matched, to the average DUT array spacing at a design temperature for the probe system.

Probe head assembly 18 may include any suitable number of probe heads 20. As examples, the probe head assembly may include at least 2, at least 4, at least 6, at least 8, at least 10, at least 15, at least 20, at least 25, at least 30, at least 40, at least 50, and/or at least 60 probe heads. Stated another way, a number of probe heads within the probe head assembly may be at least a threshold fraction of a number of DUTs on substrate 90. Examples of the threshold fraction of the number of DUTs include at least 10%, at least 20%, at least 30%, at least 40%, at least 50%, at least 60%, at least 70%, at least 80%, at least 90%, or 100%.

Chuck 30 defines a support surface 32. Support surface 32 may be a planar, or at least substantially planar, support surface 32 and may be configured to contact and/or support substrate 90 and/or DUTs 92 thereof.

As illustrated in dashed lines in FIG. 4, probe system 10 further may include an orientation-regulating structure 40. Orientation-regulating structure 40 may be adapted, configured, designed, and/or constructed to regulate, control, and/or define a relative orientation between probe head assembly 18 and support surface 32 and/or substrate 90. Orientation-regulating structure may be associated with, operatively attached to, configured to translate, and/or configured to rotate any suitable portion and/or structure of probe system 10 in any suitable manner.

This may include translation and/or rotation of probe head assembly 18 and/or of chuck 30 as a unit. As an example, orientation-regulating structure 40 may be configured to operatively translate the probe head assembly relative to the support surface within an alignment plane, such as the X-Y plane of FIG. 4, that is parallel, or at least substantially parallel, to the support surface. As another example, orientation-regulating structure 40 may be configured to operatively translate the probe head assembly relative to the support surface along a contacting axis, such as the Z-axis of FIG. 4, that is perpendicular, or at least substantially perpendicular, to the support surface. As yet another example, the orientation-regulating structure may be configured to operatively rotate the probe head assembly relative to the support surface about the contacting axis. As another example, the orientation-regulating structure may be configured to operatively translate the chuck relative to the probe head assembly within the alignment plane. As yet another example, the orientation-regulating structure may be configured to operatively translate the chuck relative to the probe head assembly along the contacting axis. As another example, the orientation-regulating structure may be configured to operatively rotate the chuck relative to the probe head assembly about the contacting axis. Such relative motion between the probe head assembly and the chuck may facilitate alignment of probe tips 22 with contact pads 94 within the alignment plane.

This also may include translation of probe head assembly 18 and/or of chuck 30 along the contacting axis. Such relative motion along the contacting axis may permit probe system 10 to establish and/or cease contact between the probe head assembly and the substrate.

This also may include translation of a portion, or region, of probe head assembly 18 relative to another portion, or region, of the probe head assembly. As an example, orientation-regulating structure 40 may be configured to operatively translate at least a first subset of the plurality of probe heads 20 relative to a second subset of the plurality of probe heads along the contacting axis. Such relative motion between the first subset of the plurality of probe heads and the second subset of the plurality of probe heads may facilitate contact between all probe tips and substrate 90 during circumstances in which substrate 90 is not planar, in which substrate 90 is warped, and/or in which all contact pads 94 do not extend within, or at least substantially within, a single contact pad plane.

As also illustrated in dashed lines in FIG. 4, probe system 10 may include an enclosure 70 that defines an enclosed volume 72. Support surface 32, at least a portion of probe tips 22, and/or substrate 90, when present, may extend and/or be positioned within the enclosed volume. Enclosure 70 may be configured to control and/or regulate an environment within enclosed volume 72. This may include limiting propagation of electromagnetic radiation into and/or within the enclosed volume, limiting propagation of magnetic fields into and/or within the enclosed volume, and/or limiting propagation of electric fields into and/or within the enclosed volume. This also may include controlling and/or regulating a chemical composition of a gas that extends within the enclosed volume, controlling and/or regulating a moisture content of the gas, and/or controlling and/or regulating a temperature of the gas.

As also illustrated in dashed lines in FIG. 4, probe system 10 further may include a temperature-regulating structure 80. Temperature-regulating structure 80, when present, may be adapted, configured, designed, and/or constructed to control and/or regulate a temperature of chuck 30, a temperature of support surface 32, a temperature of substrate 90, a temperature of probe head assembly 18, a temperature of probe heads 20, and/or a temperature of probe tips 22. This may include controlling and/or regulating the temperature over a test temperature range such that probe system 10 may test substrate 90 at a plurality of different test temperatures within the test temperature range. As examples, the test temperature range may have a lower temperature of at least −100° C., at least −80° C., at least −60° C., at least −40° C., at least −20° C., at least 0° C., at least 20° C., at least 40° C., and/or at least 60° C. As additional examples, the test temperature range may have an upper temperature of at most 600° C., at most 550° C., at most 500° C., at most 450° C., at most 400° C., at most 350° C., at most 300° C., at most 250° C., and/or at most 200° C. Stated another way, the test temperature range may encompass, cover, and/or extend across a range of at least 100° C., at least 150° C., at least 200° C., at least 250° C., at least 300° C., at least 350° C., at least 400° C., at least 450° C., at least 500° C., at least 550° C., at least 600° C., at least 650° C., and/or at least 700° C.

As also illustrated in dashed lines in FIG. 1, probe system 10 may include one or more contact-detecting structures 85 configured to detect and/or determine contact between probe tips 22 and corresponding contact pads 94. An example of contact-detecting structure 85 includes an optical contact-detecting structure, such as a camera, a charge coupled device, an optical assembly, and/or a microscope. Such an optical contact-detecting structure may be configured to visually and/or optically detect alignment of and/or contact between one or more probe tips 22 and one or more corresponding contact pads 94, such as by observing the alignment and/or the contact. Another example of a contact-detecting structure 85 includes an electrical contact-detecting structure, such as a continuity detection circuit. Such an electrical contact-detecting structure may be configured to electrically detect contact between one or more probe tips 22 and one or more corresponding contact pads 94, such as by detecting electrical continuity in a circuit that is formed via contact between the one or more probe tips and the one or more corresponding contact pads.

Controller 60 may include and/or be any suitable structure, device, and/or devices that may be adapted, configured, designed, constructed, and/or programmed to perform the functions discussed herein. This may include controlling the operation of at least a portion of probe system 10, such as of probe head assembly 18, chuck 30, orientation-regulating structure 40, and/or temperature-regulating structure 80. Additionally or alternatively, controller 60 may be programmed to control the operation of probe system 10 according to, or such that the probe system performs, any suitable portion, or subset, of methods 100, which are discussed in more detail herein. Examples of controller 60 include one or more of an electronic controller, a dedicated controller, a special-purpose controller, a personal computer, a special-purpose computer, a display device, a logic device, a memory device, and/or a memory device having computer-readable storage media 62.

The computer-readable storage media, when present, also may be referred to herein as non-transitory computer readable storage media. This non-transitory computer readable storage media may include, define, house, and/or store computer-executable instructions, programs, and/or code; and these computer-executable instructions may direct probe system 10 and/or controller 60 thereof to perform any suitable portion, or subset, of methods 100. Examples of such non-transitory computer-readable storage media include CD-ROMs, disks, hard drives, flash memory, etc. As used herein, storage, or memory, devices and/or media having computer-executable instructions, as well as computer-implemented methods and other methods according to the present disclosure, are considered to be within the scope of subject matter deemed patentable in accordance with Section 101 of Title 35 of the United States Code.

Substrate 90 may include and/or be any suitable substrate that may support, or have defined thereon, DUTs 92. As examples, substrate 90 may include one or more of a wafer, a semiconductor wafer, a silicon wafer, and/or a III-V semiconductor wafer. When substrate 90 includes the semiconductor wafer, the semiconductor wafer may include and/or be a conventional, round, or at least substantially round, semiconductor wafer. The round semiconductor wafer may have and/or define a diameter, or a nominal diameter, of 25 millimeters (mm), 50 mm, 75 mm, 100 mm, 150 mm, 200 mm, 300 mm, and/or 450 mm.

Figure 5:
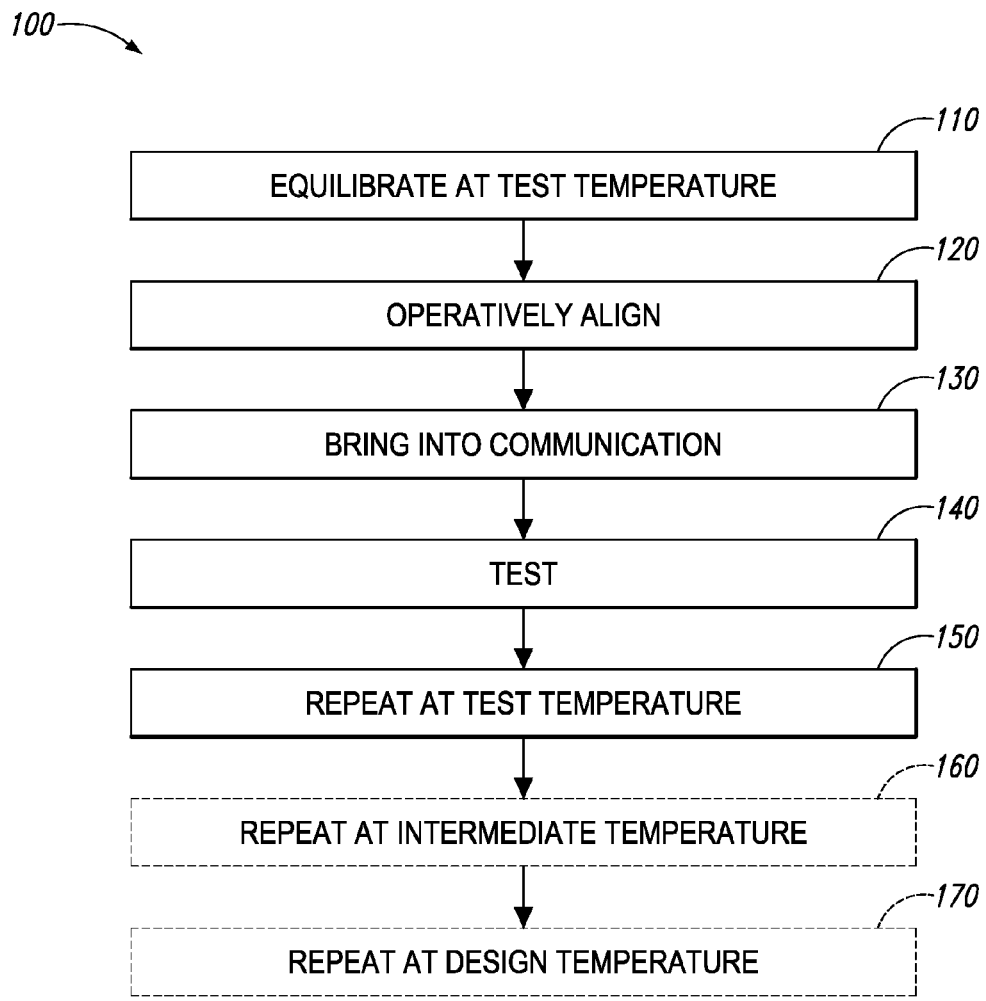
FIG. 5 is a flowchart depicting methods, according to the present disclosure, of testing a plurality of devices under test.
Figure 10:
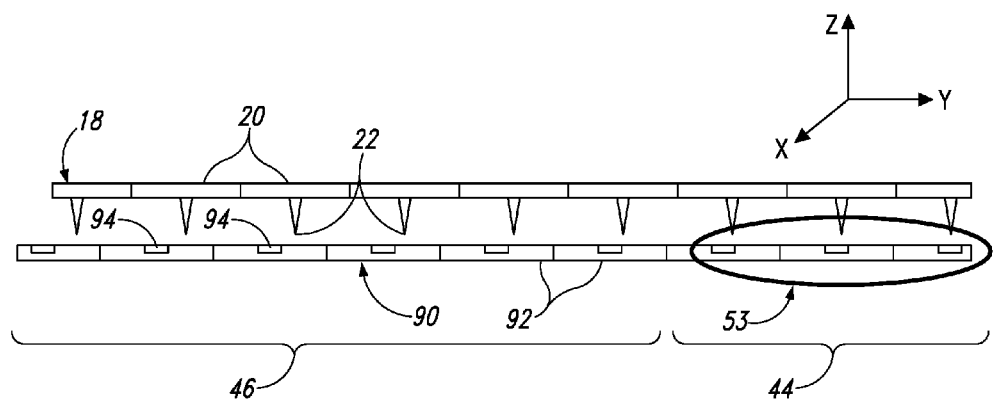
FIG. 10 is another schematic illustration of a portion of the method of FIG. 5 being performed at the test temperature.
Figure 11:
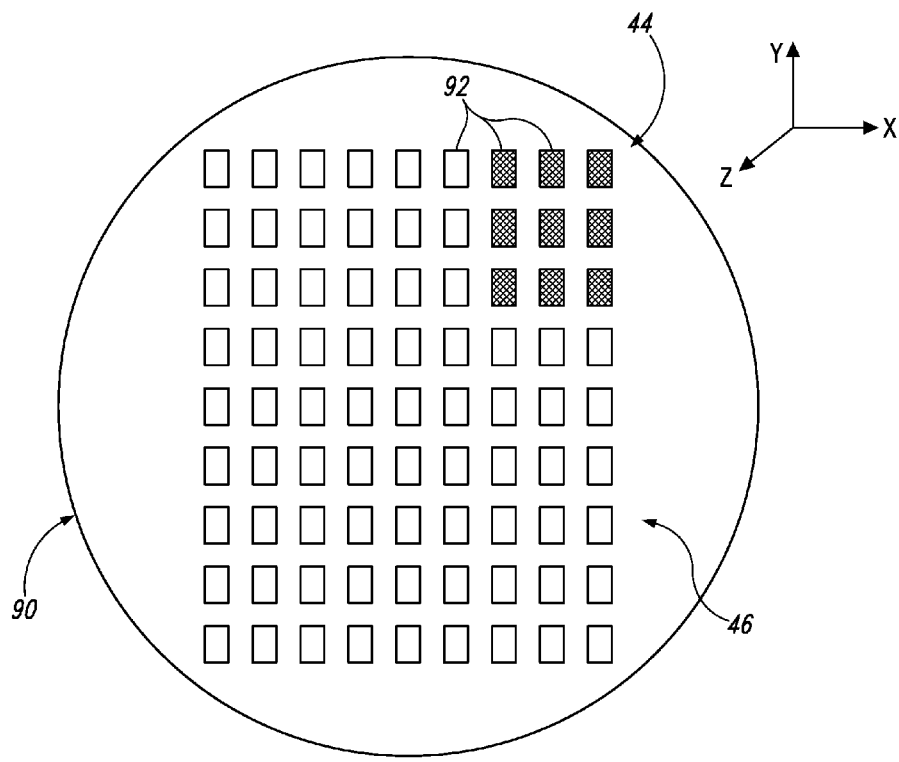
FIG. 11 is another schematic illustration of a portion of the method of FIG. 5 being performed at the test temperature.
Figure 12:
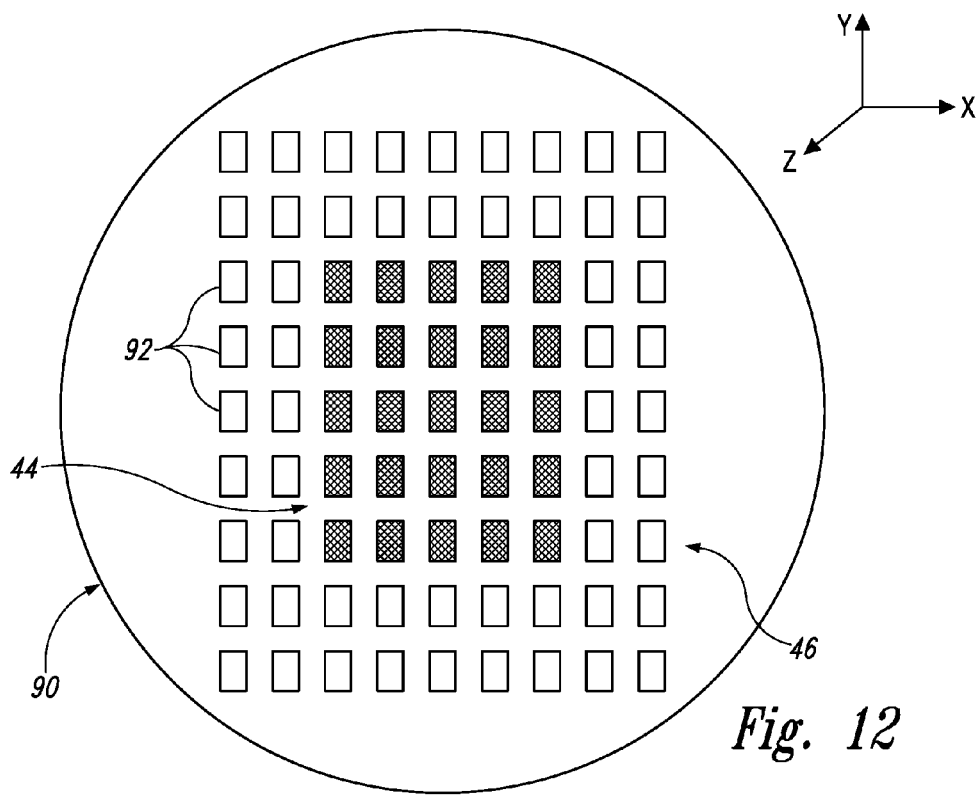
FIG. 12 is a schematic illustration of a portion of the method of FIG. 5 being performed at an intermediate temperature that is different from the test temperature and from the design temperature.
Figure 13:
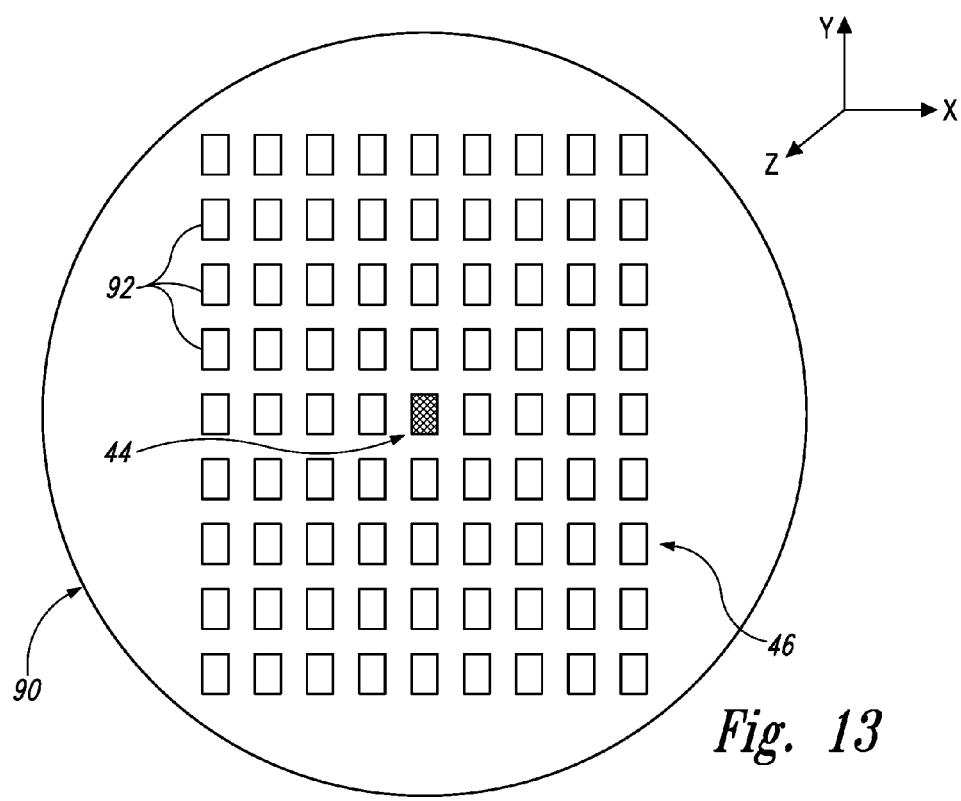
FIG. 13 is another schematic illustration of a portion of the method of FIG. 5 being performed at the intermediate temperature.
Figure 14:
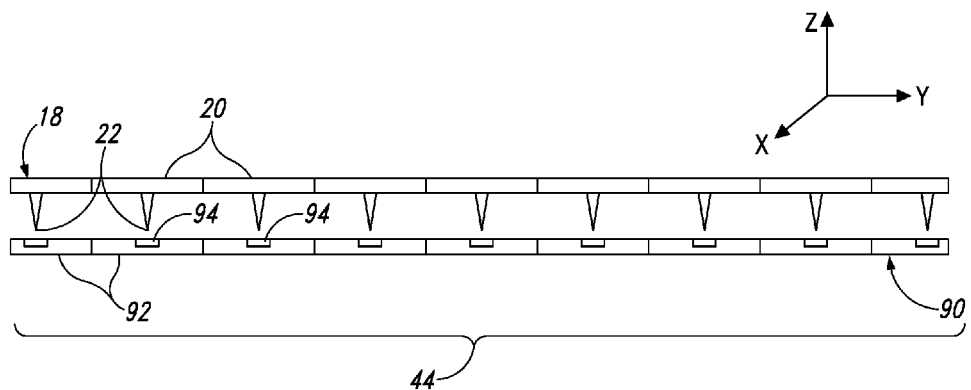
FIG. 14 is a schematic illustration of a portion of the method of FIG. 5 being performed at the design temperature.
Figure 15:
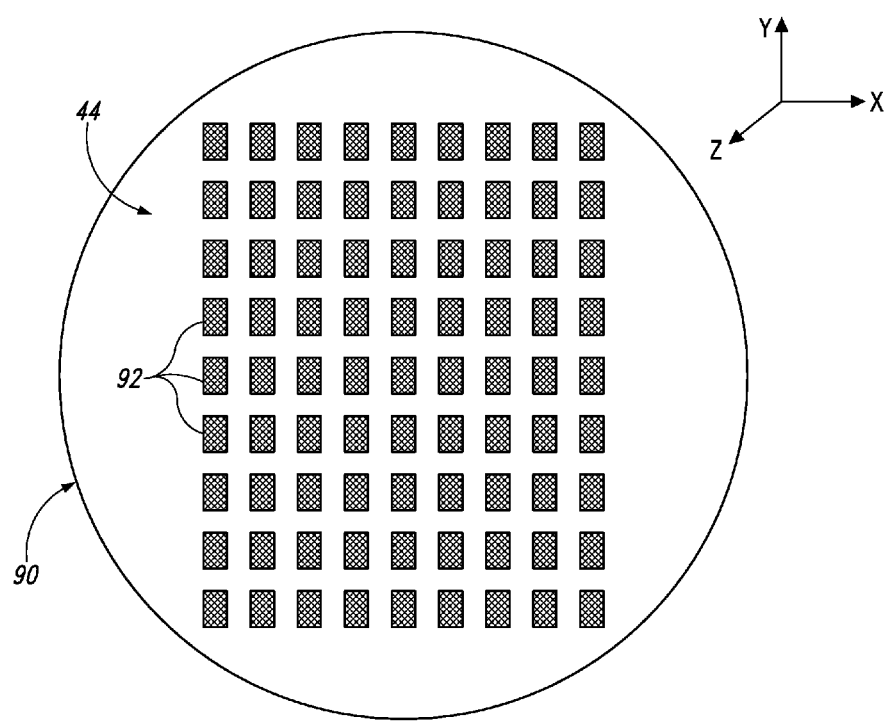
FIG. 15 is another schematic illustration of a portion of the method of FIG. 5 being performed at the design temperature.

FIG. 5 is a flowchart depicting methods 100, according to the present disclosure, of testing a plurality of devices under test. FIGS. 6-11 are schematic illustrations of portions of the method of FIG. 5 being performed at a test temperature that is different from a design temperature of a probe head assembly, while FIGS. 12-13 are schematic illustrations of a portion of the method of FIG. 5 being performed at the design temperature of the probe head assembly. FIGS. 13-15 further illustrate a number of probes that may contact corresponding contact pads at different temperatures. In FIGS. 6-15, contact pads 94 of DUTs 92 are smaller than corresponding contact pads 94 of DUTs 92 in FIGS. 1-3, and methods 100 of FIG. 5-15 may permit testing over a broad test temperature range, examples of which are disclosed herein, without the need for the oversized contact pads that are discussed herein with reference to FIGS. 1-3.

Methods 100 include equilibrating at the test temperature at 110, operatively aligning at 120, bringing into communication at 130, testing at 140, and repeating, at 150, at least a portion of the methods at the test temperature. Methods 100 further may include repeating, at 160, at least a portion of the methods at an intermediate temperature and/or repeating, at 170, at least a portion of the methods at the design temperature.

Equilibrating at the test temperature at 110 may include equilibrating a substrate, which includes a plurality of devices under test arranged in a DUT array, and a probe head assembly, which includes a plurality of probe heads arranged in a probe head array, at the test temperature. The test temperature may be different from the design temperature of the probe head assembly. As such, subsequent to the equilibrating at 110, the probe head array may define an average probe head array spacing that differs from an average DUT array spacing of the DUT array, as discussed herein with reference to FIGS. 1-3. The average probe head array spacing may be measured in an alignment plane that is parallel, or at least substantially parallel, to a surface of the substrate that includes the DUTs.

It is within the scope of the present disclosure that the equilibrating at 110 may include equilibrating such that, at the test temperature, the average probe head array spacing is within a threshold spacing difference range of the average DUT array spacing. As examples, the threshold spacing difference range may be at least 0.1 micrometer, at least 0.2 micrometers, at least 0.4 micrometers, at least 0.6 micrometers, at least 0.8 micrometers, at least 1 micrometer, at least 2 micrometers, at least 3 micrometers, at least 4 micrometers, at least 5 micrometers, at least 10 micrometers, at least 20 micrometers, and/or at least 30 micrometers. Additionally or alternatively, the threshold spacing difference range may be at most 100 micrometers, at most 80 micrometers, at most 60 micrometers, at most 40 micrometers, at most 20 micrometers, at most 15 micrometers, at most 10 micrometers, at most 8 micrometers, at most 6 micrometers, at most 4 micrometers, and/or at most 2 micrometers. The difference between the average probe head array spacing and the average DUT array spacing (i.e., the threshold spacing difference range) may be a result of a difference between a coefficient of thermal expansion, or an effective coefficient of thermal expansion, of the substrate and a coefficient of thermal expansion, or an effective coefficient of thermal expansion, of the probe head assembly.

Operatively aligning at 120 may include operatively aligning each probe tip of a first subset of the plurality of probe heads with a corresponding contact pad of a first subset of the plurality of DUTs. This may include operatively aligning such that at least one probe tip of at least one probe head is misaligned with the corresponding contact pad of the corresponding DUT. The operative alignment may be within, or parallel to, the alignment plane and/or may be perpendicular to the alignment plane.

Figure 6:
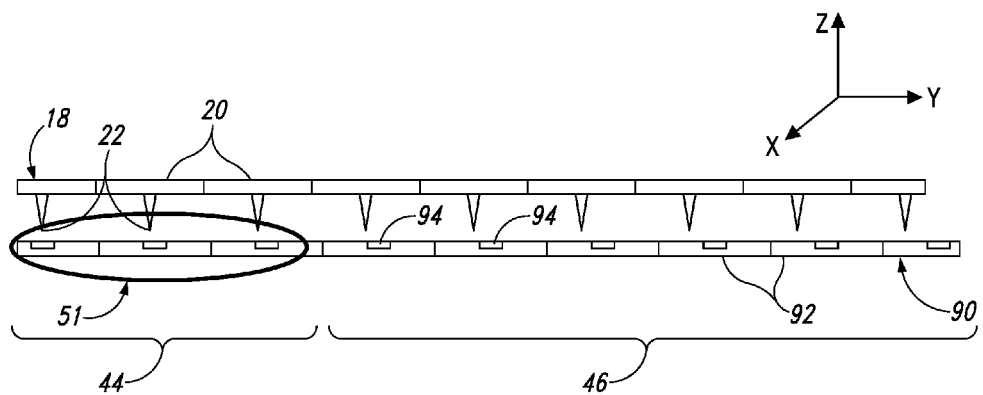
FIG. 6 is a schematic illustration of a portion of the method of FIG. 5 being performed at a test temperature that is different from a design temperature.
Figure 7:
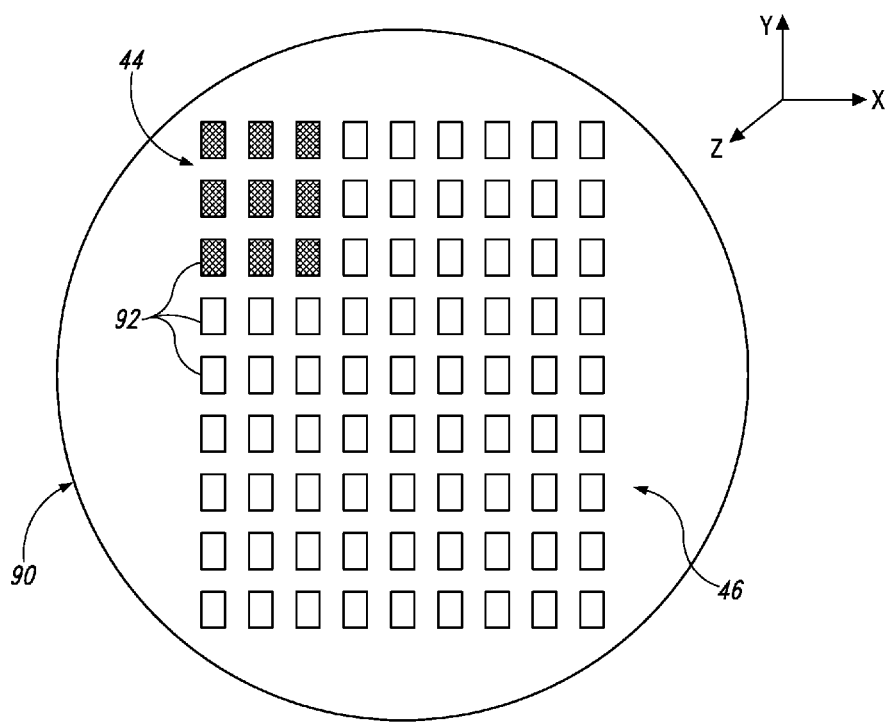
FIG. 7 is another schematic illustration of a portion of the method of FIG. 5 being performed at the test temperature.

The operatively aligning at 120 is schematically illustrated in FIGS. 6-7 and indicated at 51. As illustrated in FIG.

6, probe tips 22 and contact pads 94 within the first subset are operatively aligned with one another such that the probe tips may contact and/or communicate with the contact pads. However, probe tips 22 that are outside the first subset are not aligned with, may not contact, and/or may not communicate with the corresponding contact pads. Stated another way, the operatively aligning at 120 may include aligning such that each probe tip in a misaligned subset 46 of the plurality of probe heads (e.g., probe heads outside the first subset) is misaligned with the corresponding contact pad, while each probe tip in an aligned subset 44 (e.g., probe tips within first subset 51) is aligned with the corresponding contact pad.

FIG. 7 illustrates aligned subset 44 in solid rectangles and misaligned subset 46 in open rectangles. As illustrated in FIG. 7, substrate 90 may include a two-dimensional array of DUTs 92, and misaligned subset 46 may include a subset of, or fewer than all, DUTs as measured in each direction (such as the X and Y-directions of FIG. 7) within the two-dimensional array.

It is within the scope of the present disclosure that the first subset of the plurality of probe heads may include any suitable number, or fraction, of the plurality of probe heads. As an example, the first subset of the plurality of probe heads may include at least 5%, at least 10%, at least 15%, and/or at least 20% of the plurality of probe heads. Additionally or alternatively, the first subset of the plurality of probe heads may include at most 50%, at most 40%, at most 30%, at most 20%, and/or at most 10% of the plurality of probe heads. Stated another way, the first subset of the plurality of probe heads may include one or more probe heads, including at least 1, at least 2, at least 3, at least 4, at least 6, at least 8, at least 10, at least 15, at least 20, at least 25, and/or at least 30 probe heads.

Similarly, it is also within the scope of the present disclosure that the misaligned subset of the plurality of probe heads may include any suitable number, or fraction, of the plurality of probe heads. As an example, the misaligned subset of the plurality of probe heads may include at least 10%, at least 20%, at least 30%, at least 40%, at least 50%, at least 60%, at least 70%, and/or at least 80% of the plurality of probe heads. Additionally or alternatively, the misaligned subset of the plurality of probe heads may include at most 95%, at most 90%, at most 80%, at most 70%, at most 60%, at most 50%, at most 40%, and/or at most 30% of the plurality of probe heads. Stated another way, the misaligned subset of the plurality of probe heads may include at least 1, at least 2, at least 3, at least 4, at least 6, at least 8, at least 10, at least 15, at least 20, at least 25, and/or at least 30 fewer than a total number of probe heads in the plurality of probe heads.

The operatively aligning at 120 may be accomplished in any suitable manner. As an example, the operatively aligning at 120 may include operatively translating and/or rotating the substrate relative to the probe head assembly. Additionally or alternatively, the operatively aligning at 120 may include operatively translating and/or rotating the probe head assembly relative to the substrate. This may include operatively translating and/or rotating within a plane that is parallel, or at least substantially parallel, to a surface of the substrate that includes and/or supports the plurality of DUTs, such as the X-Y plane of FIG. 4.

As another example, the operatively aligning at 120 may include operatively translating at least one probe head in the plurality of probe heads relative to at least one other probe head in the plurality of probe heads. This may include operatively translating the at least one probe head along a contacting axis that is perpendicular, or at least substantially perpendicular, to the alignment plane. Stated another way, the operatively aligning at 120 may include operatively translating one or more probe heads along the contacting axis and relative to one another such that a distance between each probe head in the plurality of probe heads and each corresponding DUT in the plurality of DUTs is constant, is at least substantially constant, and/or is within a threshold distance range. Such a configuration may facilitate contact between the probe heads and the corresponding contact pads of the corresponding DUTs during conditions in which the substrate may be deformed and/or may be nonplanar.

Bringing into communication at 130 may include bringing each probe tip of each probe head of the first subset of the plurality of probe heads into communication with the corresponding contact pad of the first subset of the plurality of DUTs. This may include bringing each probe tip of the first subset of the plurality of probe heads into physical contact with the corresponding contact pad, into electrical communication with the corresponding contact pad, into optical communication with the corresponding contact pad, and/or into electromagnetic communication with the corresponding contact pad.

As a more specific example, the bringing into communication at 130 may include physically contacting each probe tip in the first subset of the plurality of probe heads with the corresponding contact pad in the first subset of the plurality of contact pads. Concurrently, the bringing into communication at 130 also may include physically contacting each probe tip of each probe head of the misaligned subset of the plurality of probe heads with a portion of the corresponding DUT that does not include the corresponding contact pad of the corresponding DUT. This is illustrated in FIG. 6 at 46, with probe tips 22 that are outside first subset 51 (e.g., that are in misaligned subset 46) contacting corresponding DUTs 92 but being misaligned from contact pads 94 thereof.

Testing at 140 may include testing the operation of the first subset of the plurality of DUTs and may be accomplished in any suitable manner. As an example, the testing at 140 may include providing a respective test signal to each DUT in the first subset of the plurality of DUTs, such as via a respective probe tip that contacts the corresponding contact pad of each DUT. As another example, the testing at 140 may include receiving a respective resultant signal from each DUT in the first subset of the plurality of DUTs, such as via the, or another, probe tip that contacts the DUT and/or a contact pad thereof.

Repeating, at 150, at least the portion of the methods at the test temperature may include repeating any suitable portion of methods 100 to test a second subset of the plurality of DUTs with and/or utilizing probe tips of a second subset of the plurality of probe heads. As an example, the repeating at 150 may include repeating the operatively aligning at 120 to align each probe tip of the second subset of the plurality of probe heads with corresponding contact pads of the second subset of the plurality of DUTs. The second subset of the plurality of probe heads may be at least partially, or even completely, different from the first subset of the plurality of probe heads. Similarly, the second subset of the plurality of DUTs may be at least partially, or even completely, different from the first subset of the plurality of DUTs.

As another example, the repeating at 150 may include repeating the bringing into communication at 130 to bring each probe tip of the second subset of the plurality of probe heads into communication with the corresponding contact pad of the second subset of the plurality of DUTs. As yet another example, the repeating at 150 may include repeating the testing at 140 to test the operation of the second subset of the plurality of DUTs.

Figure 8:
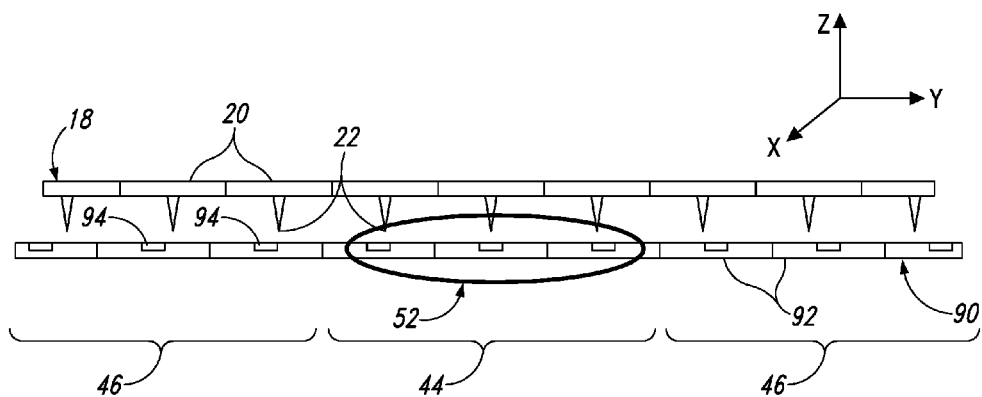
FIG. 8 is another schematic illustration of a portion of the method of FIG. 5 being performed at the test temperature.
Figure 9:
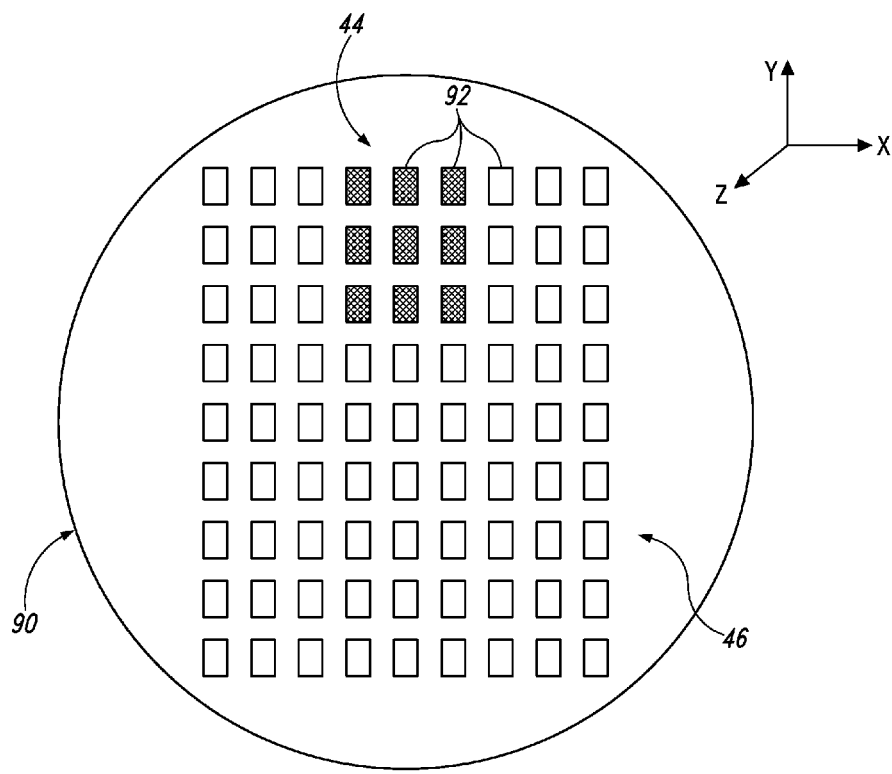
FIG. 9 is another schematic illustration of a portion of the method of FIG. 5 being performed at the test temperature.

The repeating at 150 is schematically illustrated in FIGS. 8-11. As indicated in FIG. 8 at 52, probe head assembly 18 is aligned with substrate 90 such that probe tips 22 of a second subset of the plurality of probe heads 20 is aligned with corresponding contact pads 94 of a second subset of the plurality of DUTs 92. Stated another way, probe tips 22 within aligned subset 44 contact corresponding contact pads, while probe tips within misaligned subset 46 do not contact corresponding contact pads. FIG. 9 illustrates that aligned subset 44 and misaligned subset 46 once again may extend in two dimensions.

The repeating at 150 may be repeated any suitable number of times to test any suitable number of subsets of the plurality of DUTs. This is illustrated in FIGS. 10-11. As indicated in FIG. 10 at 53, probe tips 22 of a subsequent subset of the plurality of probe heads 20 are aligned with contact pads 94 of a subsequent subset of the plurality of DUTs to permit testing of the subsequent subset of the plurality of DUTs. FIG. 11 once again illustrates that aligned subset 44 and misaligned subset 46 may extend in two dimensions.

Repeating, at 160, at least the portion of the methods at the intermediate temperature may include repeating any suitable portion of methods 100 at one or more intermediate temperatures, which are different from, or between, the test temperature and the design temperature. As an example, the repeating at 160 may include repeating the equilibrating at 110 to equilibrate the probe head assembly and the substrate at the intermediate temperature. As another example, the repeating at 160 may include repeating the operatively aligning at 120 to operatively align each probe tip of a third subset of the plurality of probe heads with a corresponding contact pad of a third subset of the plurality of DUTs. As yet another example, the repeating at 160 may include repeating the bringing at 130 to bring each probe tip of the third subset of the plurality of probe heads into communication with the corresponding contact pad. As another example, the repeating at 160 may include repeating the testing at 140 to test the operation of the third subset of the plurality of DUTs. As yet another example, the repeating at 160 may include repeating the repeating at 150 to test a subsequent subset of the plurality of DUTs at the intermediate temperature.

The intermediate temperature may be different from the design temperature, closer to the design temperature than the test temperature is to the design temperature, and/or farther from the design temperature than the test temperature is from the design temperature. As such, the third subset of the plurality of probe heads may include a different number of, a greater number of, and/or fewer probe heads than a number of probe heads in the first subset of the plurality of probe heads and/or in the second subset of the plurality of probe heads. This is schematically illustrated in FIGS. 12-13. FIG. 12 illustrates a condition in which, at the intermediate temperature, the number of probe heads in aligned subset 44 is greater than the number of probe heads in aligned subset 44 of FIGS. 6-11 (i.e., at the test temperature). In contrast, FIG. 13 illustrates a condition in which, at the intermediate temperature, the number of probe heads in aligned subset 44 is less than the number of probe heads in aligned subset 44 of FIGS. 6-11 (i.e., at the test temperature).

The third subset of the plurality of probe heads may include one or more probe heads from the first, second, and/or subsequent subsets of the plurality of probe heads. Similarly, the third subset of the plurality of DUTs may include one or more DUTs from the first, second, and/or subsequent subsets of the plurality of DUTS. However, the third subset of the plurality of probe heads still may not include every probe head in the plurality of probe heads. Stated another way, the average probe head array spacing when the probe head assembly is at the intermediate temperature may be different from the average DUT array spacing when the substrate is at the intermediate temperature and/or may be sufficiently different to preclude contact between all probe tips and all corresponding contact pads. However, a difference between the average probe head array spacing and the average DUT array spacing at the intermediate temperature may be less than a corresponding difference at the test temperature.

Repeating, at 170, at least the portion of the methods at the design temperature may include repeating any suitable portion of methods 100 at the design temperature. As an example, the repeating at 170 may include repeating the equilibrating at 110 to equilibrate the substrate and the probe head assembly at the design temperature. As another example, the repeating at 170 may include repeating the operatively aligning at 120 to operatively align each probe tip of each probe head in the plurality of probe heads with the corresponding contact pad of the corresponding DUT of the plurality of DUTs. As yet another example, the repeating at 170 may include repeating the bringing into communication at 130 to bring each probe tip of each probe head in the plurality of probe heads into communication with the corresponding contact pad. As another example, the repeating at 170 may include repeating the testing at 140 to test the operation of each DUT of the plurality of DUTs.

As discussed, the probe head assembly may be configured such that, at the design temperature, the average probe head array spacing matches, or at least substantially matches, the average DUT array spacing. As such, the repeating at 170 may include simultaneously contacting each probe tip of each probe head with the corresponding contact pad of the corresponding DUT. This is illustrated in FIGS. 14-15, where each probe tip 22 of probe head assembly 18 contacts a corresponding contact pad 94 of DUTs 92. Stated another way, at the design temperature, each probe head in the probe head assembly is included in aligned subset 44.

It is within the scope of the present disclosure that the repeating at 170 may include simultaneously and/or sequentially testing each DUT of the plurality of DUTs. Additionally or alternatively, the repeating at 170 may include maintaining communication between each probe tip of each probe head of the plurality of probe heads and each corresponding contact pad of the plurality of DUTs during the testing of the plurality of DUTs.

It is within the scope of the present disclosure that a number of probe heads in the plurality of probe heads may correspond to, or equal, a total number of DUTs on the substrate. Stated another way, it is within the scope of the present disclosure that the plurality of DUTs may include each, or every, DUT that is on the substrate. However, this is not required, and the plurality of DUTs may include a fraction, a subset, or fewer than all, of the total number of DUTs that are on the substrate.

As discussed, conventional DUTs generally have contact pads with widths on the order of hundreds of microns, and these large contact pads often are required in order to permit conventional probe systems to test the conventional DUTs over a broad test temperature range. In contrast, the probe systems, storage media, and methods disclosed herein permit the width of the contact pads to decrease significantly, such as to widths of 50 micrometers, or less.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

Illustrative, non-exclusive examples of methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A method of testing a plurality of devices under test (DUTs), which is present on a substrate, with a probe head assembly, which includes a plurality of probe heads, wherein each of the plurality of DUTs includes a contact pad, wherein each of the plurality of probe heads includes a probe tip configured to communicate with a corresponding contact pad of a corresponding DUT of the plurality of DUTs, wherein the plurality of DUTs is arranged on the substrate in a DUT array that defines an average DUT array spacing, wherein the plurality of probe heads is arranged within the probe head assembly in a probe head array that defines an average probe head array spacing, and further wherein the average probe head array spacing is matched to the average DUT array spacing at a design temperature, the method comprising:

equilibrating the substrate and the probe head assembly to a test temperature that is different from the design temperature, wherein, at the test temperature, the average probe head array spacing differs from the average DUT array spacing;

operatively aligning each probe tip of a first subset of the plurality of probe heads with the corresponding contact pad of a first subset of the plurality of DUTs, wherein the operatively aligning includes operatively aligning such that at least one probe tip of at least one probe head of the plurality of probe heads is misaligned with the corresponding contact pad of the corresponding DUT of the plurality of DUTs;

bringing each probe tip of the first subset of the plurality of probe heads into communication with the corresponding contact pad of the first subset of the plurality of DUTs;

testing the operation of the first subset of the plurality of DUTs; and repeating the operatively aligning, the bringing, and the testing to:

(i) align each probe tip of a second subset of the plurality of probe heads, which is different from the first subset of the plurality of probe heads, with the corresponding contact pad of a second subset of the plurality of DUTs, which is different from the first subset of the plurality of DUTs;

(ii) bring each probe tip of the second subset of the plurality of probe heads into communication with the corresponding contact pad of the second subset of the plurality of DUTs; and (iii) test the operation of the second subset of the plurality of DUTs.

A2. The method of paragraph A1, wherein the equilibrating includes equilibrating such that, at the test temperature, the average probe head array spacing, as measured within an/the alignment plane that is parallel, or at least substantially parallel, to a/the surface of the substrate that includes the plurality of DUTs, is within a threshold spacing difference range of the average DUT array spacing.

A3. The method of paragraph A2, wherein the threshold spacing difference range is at least one of:

(i) at least 0.1 micrometer, at least 0.2 micrometers, at least 0.4 micrometers, at least 0.6 micrometers, at least 0.8 micrometers, at least 1 micrometer, at least 2 micrometers, at least 3 micrometers, at least 4 micrometers, at least 5 micrometers, at least 10 micrometers, at least 20 micrometers, or at least 30 micrometers; and (ii) at most 100 micrometers, at most 80 micrometers, at most 60 micrometers, at most 40 micrometers, at most 20 micrometers, at most 15 micrometers, at most 10 micrometers, at most 8 micrometers, at most 6 micrometers, at most 4 micrometers, or at most 2 micrometers.

A4. The method of any of paragraphs A2-A3, wherein the threshold spacing difference range is a result of a difference between a coefficient of thermal expansion of the substrate and a coefficient of thermal expansion of the probe head assembly.

A5. The method of any of paragraphs A1-A4, wherein the first subset of the plurality of probe heads includes at least one of:

(i) at least 5%, at least 10%, at least 15%, or at least 20% of the plurality of probe heads; and (ii) at most 50%, at most 40%, at most 30%, at most 20%, or at most 10% of the plurality of probe heads.

A6. The method of any of paragraphs A1-A5, wherein the first subset of the plurality of probe heads includes at least 1, at least 2, at least 3, at least 4, at least 6, at least 8, at least 10, at least 15, at least 20, at least 25, or at least 30 probe heads.

A7. The method of any of paragraphs A1-A6, wherein the operatively aligning includes operatively aligning such that each probe tip in a misaligned subset of the plurality of probe heads is misaligned with the corresponding contact pad.

A8. The method of paragraph A7, wherein the misaligned subset of the plurality of probe heads includes at least one of:

(i) at least 10%, at least 20%, at least 30%, at least 40%, at least 50%, at least 60%, at least 70%, or at least 80% of the plurality of probe heads; and (ii) at most 95%, at most 90%, at most 80%, at most 70%, at most 60%, at most 50%, at most 40%, or at most 30% of the plurality of probe heads.

A9. The method of any of paragraphs A1-A8, wherein the operatively aligning includes operatively translating at least one of the substrate and the probe head assembly relative to the other of the substrate and the probe head assembly.

A10. The method of paragraph A9, wherein the operatively translating includes operatively translating within an/the alignment plane that is parallel, or at least substantially parallel, to a/the surface of the substrate that includes the DUTs.

A11. The method of any of paragraphs A1-A10, wherein the operatively aligning includes operatively rotating at least one of the substrate and the probe head assembly relative to the other of the substrate and the probe head assembly within an/the alignment plane that is parallel, or at least substantially parallel, to a/the surface of the substrate that includes the DUTs to rotationally align the plurality of probe heads with the plurality of DUTs.

A12. The method of any of paragraphs A1-A11, wherein the operatively aligning includes operatively translating at least one probe head, in the plurality of probe heads, relative to at least one other probe head, in the plurality of probe heads, along a contacting axis that is perpendicular, or at least substantially perpendicular, to a/the surface of the substrate that includes the plurality of DUTs such that a distance between each probe head in the plurality of probe heads and each corresponding DUT in the plurality of DUTs is constant, at least substantially constant, or within a threshold distance range.

A13. The method of any of paragraphs A1-A12, wherein the operatively aligning includes at least one of:

(i) operatively aligning in directions that are parallel, or at least substantially parallel, to an/the alignment plane that is parallel, or at least substantially parallel, to the surface of the substrate that includes the plurality of DUTs; and (ii) operatively aligning along a/the contacting axis that is perpendicular, or at least substantially perpendicular, to the alignment plane.

A14. The method of any of paragraphs A1-A13, wherein the bringing includes bringing each probe tip in the first subset of the plurality of probe heads into at least one of physical contact with the corresponding contact pad, electrical communication with the corresponding contact pad, optical communication with the corresponding contact pad, and electromagnetic communication with the corresponding contact pad.

A15. The method of any of paragraphs A1-A14, wherein the bringing includes physically contacting each probe tip in the first subset of the plurality of probe heads with the corresponding contact pad.

A16. The method of any of paragraphs A1-A15, wherein the bringing includes physically contacting each probe tip of a/the misaligned subset of the plurality of probe heads with a portion of the corresponding DUT that does not include the corresponding contact pad of the corresponding DUT.

A17. The method of any of paragraphs A1-A16, wherein the testing includes at least one of:

(i) providing a test signal to each DUT in the first subset of the plurality of DUTs; and (ii) receiving a resultant signal from each DUT in the first subset of the plurality of DUTs.

A18. The method of any of paragraphs A1-A17, wherein the repeating includes repeating a plurality of times to utilize each probe head of the plurality of probe heads to test each corresponding DUT of the plurality of DUTs.

A19. The method of any of paragraphs A1-A18, wherein the method further includes:

equilibrating the substrate and the probe head assembly at the design temperature;

operatively aligning each probe tip of each probe head of the plurality of probe heads with the corresponding contact pad of the corresponding DUT of the plurality of DUTs;

bringing each probe tip of each probe head of the plurality of probe heads into communication with the corresponding contact pad of the corresponding DUT of the plurality of DUTs; and testing the operation of each DUT of the plurality of DUTs.

A20. The method of paragraph A19, wherein the testing the operation of each DUT of the plurality of DUTs includes at least one of simultaneously testing and sequentially testing.

A21. The method of any of paragraphs A19-A20, wherein the testing the operation of each DUT of the plurality of DUTs includes testing while maintaining the communication between each probe tip of each probe head of the plurality of probe heads and the corresponding contact pad of the corresponding DUT of the plurality of DUTs.

A22. The method of any of paragraphs A1-A21, wherein the method further includes:

equilibrating the substrate and the probe head assembly at an intermediate temperature, optionally that is at least one of different from and between the test temperature and the design temperature;

operatively aligning each probe tip of a third subset of the plurality of probe heads with the corresponding contact pad of a third subset of the plurality of DUTs, wherein the operatively aligning includes operatively aligning such that at least one probe tip of at least one probe head of the plurality of probe heads is misaligned with the corresponding contact pad of the corresponding DUT of the plurality of DUTs;

bringing each probe tip of the third subset of the plurality of probe heads into communication with the corresponding contact pad of the third subset of the plurality of DUTs; and testing the operation of the third subset of the plurality of DUTs;

wherein a number of probe heads in the third subset of the plurality of probe heads is greater than a number of probe heads in the first subset of the plurality of probe heads but less than a number of probe heads in the plurality of probe heads.

A23. The method of any of paragraphs A1-A22, wherein the DUT array includes a plurality of DUT rows, which defines an average DUT row spacing, and a plurality of DUT columns, which defines an average DUT column spacing, and further wherein the average DUT array spacing includes the average DUT row spacing and the average DUT column spacing.

A24. The method of any of paragraphs A1-A23, wherein the probe head array includes at least one of:

(i) a probe head row, or a plurality of probe head rows, which defines an average probe head row spacing; and (ii) a probe head column, or a plurality of probe head columns, which defines an average probe head column spacing.

A25. The method of paragraph A24, wherein the average probe head array spacing includes at least one, and optionally both, of the average probe head row spacing and the average probe head column spacing.

B1. A probe system configured to simultaneously test a plurality of devices under test (DUTs), which is present on a substrate, wherein each of the plurality of DUTs includes a contact pad, and further wherein the plurality of DUTs is arranged on the substrate in a DUT array that defines an average DUT array spacing, the probe system comprising:

a probe head assembly including a plurality of probe heads, wherein:

(i) each of the plurality of probe heads includes a probe tip configured to electrically contact, and communicate with, a corresponding contact pad of a corresponding DUT;

(ii) the plurality of probe heads is arranged within the probe head assembly in a probe head array that defines an average probe head array spacing; and (iii) optionally, the average probe head array spacing is at least substantially matched to the average DUT array spacing at a design temperature of the probe system;

a chuck defining a support surface configured to support the substrate; and a controller programmed to control the operation of the probe system according to the method of any of paragraphs A1-A25.

B2. The probe system of paragraph B1, wherein the probe system includes the substrate.

B3. The probe system of any of paragraphs B1-B2, wherein the probe system further includes an orientation-regulating structure configured to regulate a relative orientation between the probe head assembly and the substrate.

B4. The probe system of paragraph B3, wherein the orientation-regulating structure is configured to at least one of:

(i) operatively translate the probe head assembly relative to the support surface within an alignment plane that is parallel, or at least substantially parallel, to the support surface;

(ii) operatively translate the probe head assembly relative to the support surface along a contacting axis that is perpendicular, or at least substantially perpendicular, to the support surface;

(iii) operatively rotate the probe head assembly relative to the support surface about the contacting axis;

(iv) operatively rotate the chuck relative to the probe head assembly within the alignment plane;

(v) operatively translate the chuck relative to the probe head assembly along the contacting axis; and (vi) operatively rotate the chuck relative to the probe head assembly about the contacting axis.

B5. The probe system of any of paragraphs B3-B4, wherein the orientation-regulating structure is configured to operatively translate at least a first subset of the plurality of probe heads relative to a second subset of the plurality of probe heads along a/the contacting axis that is perpendicular, or at least substantially perpendicular, to the support surface.

B6. The probe system of any of paragraphs B1-B5, wherein the probe system further includes an enclosure that defines an enclosed volume.

B7. The probe system of paragraph B6, wherein at least one of:

(i) the support surface is positioned within the enclosed volume; and (ii) the probe tip of each of the plurality of probe heads extends at least partially within the enclosed volume.

B8. The probe system of any of paragraphs B1-B7, wherein the probe system further includes a temperature-regulating structure configured to regulate a temperature of at least one of:

(i) the chuck;

(ii) the support surface;

(iii) the substrate; and (iv) the probe head assembly.

C1. Non-transitory computer readable storage media including computer-executable instructions that, when executed, direct a probe system to perform the method of any of paragraphs A1-A25.

INDUSTRIAL APPLICABILITY

The probe systems, storage media, and methods disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, when the disclosure, the preceding numbered paragraphs, or subsequently filed claims recite "a" or "a first" element or the equivalent thereof, such claims should be understood to include incorporation of one or more such elements, neither requiring nor excluding two or more such elements.

Applicant reserves the right to submit claims directed to certain combinations and subcombinations that are directed to one of the disclosed inventions and are believed to be novel and non-obvious. Inventions embodied in other combinations and subcombinations of features, functions, elements and/or properties may be claimed through amendment of those claims or presentation of new claims in that or a related application. Such amended or new claims, whether they are directed to a different invention or directed to the same invention, whether different, broader, narrower or equal in scope to the original claims, are also regarded as included within the subject matter of the inventions of the present disclosure.

The invention claimed is:

1. A method of testing a plurality of devices under test (DUTs), which is present on a substrate, with a probe head assembly, which includes a plurality of probe heads, wherein each of the plurality of DUTs includes a contact pad, wherein each of the plurality of probe heads includes a probe tip configured to communicate with a corresponding contact pad of a corresponding DUT of the plurality of DUTs, wherein the plurality of DUTs is arranged on the substrate in a DUT array that defines an average DUT array spacing, wherein the plurality of probe heads is arranged within the probe head assembly in a probe head array that defines an average probe head array spacing, and further wherein the average probe head array spacing is matched to the average DUT array spacing at a design temperature, the method comprising:

equilibrating the substrate and the probe head assembly to a test temperature that is different from the design temperature, wherein, at the test temperature, the average probe head array spacing differs from the average DUT array spacing;

operatively aligning each probe tip of a first subset of the plurality of probe heads with the corresponding contact pad of a first subset of the plurality of DUTs, wherein the operatively aligning includes operatively aligning such that at least one probe tip of at least one probe head of the plurality of probe heads is misaligned with the corresponding contact pad of the corresponding DUT of the plurality of DUTs;

bringing each probe tip of the first subset of the plurality of probe heads into communication with the corresponding contact pad of the first subset of the plurality of DUTs;

testing the operation of the first subset of the plurality of DUTs; and repeating the operatively aligning, the bringing, and the testing to:

(i) align each probe tip of a second subset of the plurality of probe heads, which is different from the first subset of the plurality of probe heads, with the corresponding contact pad of a second subset of the plurality of DUTs, which is different from the first subset of the plurality of DUTs;

(ii) bring each probe tip of the second subset of the plurality of probe heads into communication with the corresponding contact pad of the second subset of the plurality of DUTs; and (iii) test the operation of the second subset of the plurality of DUTs.

2. The method of claim 1, wherein the equilibrating includes equilibrating such that, at the test temperature, the average probe head array spacing, as measured within an alignment plane that is at least substantially parallel to a surface of the substrate that includes the plurality of DUTs, is within a threshold spacing difference range of the average DUT array spacing, wherein the threshold spacing difference range is at least 0.1 micrometer and at most 100 micrometers.

3. The method of claim 1, wherein the first subset of the plurality of probe heads includes at least 5% and at most 50% of the plurality of probe heads.

4. The method of claim 1, wherein the first subset of the plurality of probe heads includes at least 1 probe head.

5. The method of claim 1, wherein the operatively aligning includes operatively aligning such that each probe tip in a misaligned subset of the plurality of probe heads is misaligned with the corresponding contact pad.

6. The method of claim 5, wherein the misaligned subset of the plurality of probe heads includes at least 50% and at most 95% of the plurality of probe heads.

7. The method of claim 1, wherein the misaligned subset of the plurality of probe heads includes at least one fewer than a total number of probe heads in the plurality of probe heads.

8. The method of claim 1, wherein the operatively aligning includes operatively translating at least one of the substrate and the probe head assembly relative to the other of the substrate and the probe head assembly, wherein the operatively translating includes operatively translating within an alignment plane that is at least substantially parallel to a surface of the substrate that includes the DUTs.

9. The method of claim 1, wherein the operatively aligning includes operatively rotating at least one of the substrate and the probe head assembly relative to the other of the substrate and the probe head assembly within an alignment plane that is at least substantially parallel to a surface of the substrate that includes the DUTs to rotationally align the plurality of probe heads with the plurality of DUTs.

10. The method of claim 1, wherein the operatively aligning includes operatively translating at least one probe head, in the plurality of probe heads, relative to at least one other probe head, in the plurality of probe heads, along a contacting axis that is at least substantially perpendicular to a surface of the substrate that includes the plurality of DUTs such that a distance between each probe head in the plurality of probe heads and each corresponding DUT in the plurality of DUTs is within a threshold distance range.

11. The method of claim 1, wherein the bringing includes physically contacting each probe tip in the first subset of the plurality of probe heads with the corresponding contact pad.

12. The method of claim 1, wherein the bringing includes physically contacting each probe tip of a misaligned subset of the plurality of probe heads with a portion of the corresponding DUT that does not include the corresponding contact pad of the corresponding DUT.

13. The method of claim 1, wherein the testing includes at least one of:
 (i) providing a test signal to each DUT in the first subset of the plurality of DUTs; and
 (ii) receiving a resultant signal from each DUT in the first subset of the plurality of DUTs.

14. The method of claim 1, wherein the repeating includes repeating a plurality of times to utilize each probe head of the plurality of probe heads to test each corresponding DUT of the plurality of DUTs.

15. The method of claim 1, wherein the method further includes:
 equilibrating the substrate and the probe head assembly at the design temperature;
 operatively aligning each probe tip of each probe head of the plurality of probe heads with the corresponding contact pad of the corresponding DUT of the plurality of DUTs;
 bringing each probe tip of each probe head of the plurality of probe heads into communication with the corresponding contact pad of the corresponding DUT of the plurality of DUTs; and
 testing the operation of each DUT of the plurality of DUTs.

16. The method of claim 1, wherein the method further includes:
 equilibrating the substrate and the probe head assembly at an intermediate temperature that is different from the test temperature and the design temperature;
 operatively aligning each probe tip of a third subset of the plurality of probe heads with the corresponding contact pad of a third subset of the plurality of DUTs, wherein the operatively aligning includes operatively aligning such that at least one probe tip of at least one probe head of the plurality of probe heads is misaligned with the corresponding contact pad of the corresponding DUT of the plurality of DUTs;
 bringing each probe tip of the third subset of the plurality of probe heads into communication with the corresponding contact pad of the third subset of the plurality of DUTs; and
 testing the operation of the third subset of the plurality of DUTs;
 wherein a number of probe heads in the third subset of the plurality of probe heads is greater than a number of probe heads in the first subset of the plurality of probe heads but less than a number of probe heads in the plurality of probe heads.

17. The method of claim 1, wherein the DUT array includes a plurality of DUT rows, which defines an average DUT row spacing, and a plurality of DUT columns, which defines an average DUT column spacing, and further wherein the average DUT array spacing includes the average DUT row spacing and the average DUT column spacing, and further wherein the probe head array includes at least one of:
 (i) a probe head row, or a plurality of probe head rows, which defines an average probe head row spacing; and
 (ii) a probe head column, or a plurality of probe head columns, which defines an average probe head column spacing.

18. A probe system configured to simultaneously test a plurality of devices under test (DUTs), which is present on a substrate, wherein each of the plurality of DUTs includes a contact pad, and further wherein the plurality of DUTs is arranged on the substrate in a DUT array that defines an average DUT array spacing, the probe system comprising:
 a probe head assembly including a plurality of probe heads, wherein:
 (i) each of the plurality of probe heads includes a probe tip configured to electrically contact, and communicate with, a corresponding contact pad of a corresponding DUT;
 (ii) the plurality of probe heads is arranged within the probe head assembly in a probe head array that defines an average probe head array spacing; and
 (iii) the average probe head array spacing is at least substantially matched to the average DUT array spacing at a design temperature of the probe system;
 a chuck defining a support surface configured to support the substrate; and
 a controller programmed to control the operation of the probe system according to the method of claim 1.

19. The probe system of claim 18, wherein the probe system further includes an orientation-regulating structure configured to regulate a relative orientation between the probe head assembly and the substrate.

20. The probe system of claim 18, wherein the probe system further includes a temperature-regulating structure configured to regulate a temperature of at least one of:
 (i) the chuck;
 (ii) the support surface;
 (iii) the substrate; and
 (iv) the probe head assembly.

21. Non-transitory computer readable storage media including computer-executable instructions that, when executed, direct a probe system to perform the method of claim 1.

* * * * *